United States Patent [19]

Vasile

[11] Patent Number: 4,604,591

[45] Date of Patent: Aug. 5, 1986

[54] AUTOMATICALLY ADJUSTABLE DELAY CIRCUIT HAVING ADJUSTABLE DIODE MESA MICROSTRIP DELAY LINE

[75] Inventor: Carmine F. Vasile, Huntington, N.Y.

[73] Assignee: Hazeltine Corporation, Commack, N.Y.

[21] Appl. No.: 537,181

[22] Filed: Sep. 29, 1983

[51] Int. Cl.[4] .................... H03H 9/38; H03H 11/20

[52] U.S. Cl. .................... 333/18; 333/164; 333/161; 357/56; 357/14

[58] Field of Search .................... 333/164, 161, 156, 140, 333/139, 246, 247, 18; 328/56, 55; 307/320; 357/14, 56

[56] References Cited

U.S. PATENT DOCUMENTS

| | | | |
|---|---|---|---|
| 3,013,224 | 12/1961 | King | 333/156 X |
| 3,246,265 | 4/1966 | Smith-Vaniz | 333/161 |
| 3,320,497 | 5/1967 | Neuf | 357/14 X |
| 4,160,992 | 7/1979 | Adlerstein | 357/56 X |
| 4,246,596 | 1/1981 | Iwasaki | 357/56 X |
| 4,341,999 | 7/1982 | Rudish et al. | 333/18 X |

*Primary Examiner*—Eugene R. LaRoche
*Assistant Examiner*—Benny Lee
*Attorney, Agent, or Firm*—E. A. Onders; F. R. Agovino

[57] ABSTRACT

A delay line circuit provides variable delay and phase shift to electric signals propagating along the delay circuit. The circuit is formed of a set of varactors constructed either as varactor chips or as a set of mesas upstanding from a gallium arsenide substrate. A ground plane interconnects bottom terminals of the varactor chips while a strip line conductor interconnects top terminals of the varactor chips. In the case of the mesa configuration, a metallized layer covers the regions between the mesas without contacting the base portions of the mesas. The strip line conductor makes contact with the respective mesas via a set of metallic posts upstanding from respective ones of the mesas. Dielectric material may be inserted between the strip line conductor and the metallic layer to position the strip line conductor relative to the metallic layer, which layer serves as a ground plane in a transmission line comprising the strip line conductor.

8 Claims, 10 Drawing Figures

AUTOMATICALLY ADJUSTABLE DELAY CIRCUIT HAVING ADJUSTABLE DIODE MESA MICROSTRIP DELAY LINE

BACKGROUND OF THE INVENTION

This invention relates to delay lines for electrical signals and, more particularly, to electronically variable delay lines operable at microwave frequencies.

Delay lines are utilized in signal processing operations for adjusting the time of arrival of one signal relative to that of a second signal. The delay lines may be fabricated of digital circuitry or analog circuitry, and the delay may be fixed or variable. In the case of an electronically variable delay line of analog construction, the amount of delay can be varied by application of a voltage to a control terminal of the delay line. With respect to delaying a signal having a sinusoidal waveform, this being a frequent situation in microwave applications, the effect of the delay line is to impart a phase shift; thus, in this situation the delay line may be regarded as a phase shifter.

Numerous circuits are available for imparting delay electronically variable phase shifts but few for electronically variable delay.

Thus, a problem exists in that, while microwave signal processing techniques can benefit from the utilization of electronically variable delay lines and phase shifters, the available semiconductor circuits do not provide adequate capability.

SUMMARY OF THE INVENTION

The foregoing problem is overcome and other advantages are attained by an electrical circuit embodying the invention for providing delay and phase shift to electrical signals ranging in frequency from relatively low frequencies up into the microwave region.

It is an object of the delay and phase shift circuitry of the invention to provide electronically variable phase shifts in the range of approximately 0–180 degrees at frequencies ranging up to 100 GHz.

In accordance with the invention, the circuitry is constructed with a microstrip transmission line and a set of varactor diodes, the diodes being connected across the transmission line and spaced apart in a series of locations to provide for the configuration of a delay line. Such a configuration includes the series inductance associated with the interconnection of the transmission line to the diodes, and the parallel capacitance associated with the successive diodes. The varactor diodes are constructed preferably of a high-Q semiconductor such as gallium arsenide, whereby the capacitance of a diode is variable as a function of reverse bias voltage applied across the terminals of the diode.

The microstrip transmission line comprises a ground plane formed as a metallized layer deposited on a substrate, or by means of a thin metallic cladding on an insulating support. The microstrip conductor is in the form of a ribbon of electrically conducting material, such as gold, the ribbon being spaced apart from the ground plane by a fixed distance so as to support a travelling transverse electromagnetic wave. A bias voltage is coupled to the ribbon by means of a filter circuit which precludes leakage of rf (radio frequency) energy. Thus, in one embodiment of the invention wherein the delay line is packaged within a closed box, the box is provided with three terminals, the first two terminals being input and output ports for the delay line while the third terminal serves as an access port for application of the bias voltage.

Variation in the delay, or phase shift, imparted by the delay line is dependent on the magnitude of the capacitance of the individual varactor diodes. Variation in the delay or phase shift is accomplished by varying the magnitude of the bias voltage.

With respect to an embodiment of the invention constructed as a monolithic integrated circuit, the varactor diodes are formed as means upstanding from a gallium-arsenide substrate. Metallic posts extend from the mesas to contact the ribbon-shaped microstrip conductor. The surface of the substrate supports a metallized layer which is insulated from the mesas by a set of annular grooves disposed about corresponding ones of the mesas. The space between the ribbon and the ground plane may be simply an air gap or, alternatively, may be a low loss dielectric material such as glass.

BRIEF DESCRIPTION OF THE DRAWING

The aforementioned aspects and other features of the invention are explained in the following description, taken in connection with the accompanying drawing, wherein.

For a better understanding of the present invention, together with other and further objects, reference is made to the following description, taken in conjunction with the accompanying drawings, and its scope will be pointed out in the appended claims.

DETAILED DESCRIPTION

Figure 10:
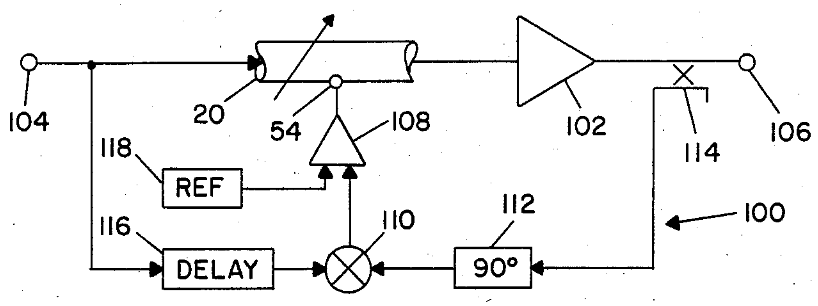
FIG. 10 is a schematic diagram of an amplifier control circuit incorporating a delay line constructed in accordance with the invention for introducing a compensation of phase and delay shift associated with variation in amplifier gain.

With reference to FIGS. 1–4, there is shown a delay line 20 incorporating the invention for providing delay and phase shifts to electric signals as will be demonstrated, by way of example, in an amplifier circuit described hereinafeter with reference to FIG. 10. The delay line 20 is enclosed within a box 22 of an electrically insulating material such as a ceramic, the box 22 including a bottom 24, sidewalls 26, a backwall 28, a front wall 30, and a cover 32. A cladding 34 of a metallic sheet, such as a copper sheet, is disposed upon the interior surface of the bottom 24. A similar form of cladding 36 is disposed on the interior surface of the cover 32, with further cladding 38 being disposed along the interior surfaces of the walls 26, 28 and 30. The upper edge of the cladding 38 may be extended and curved beyond the top of the respective walls to form end portions in the form of springs 40 which press against the cladding 36 of the cover 32 to prevent leakage of microwave energy from within the box 22.

Figure 1:
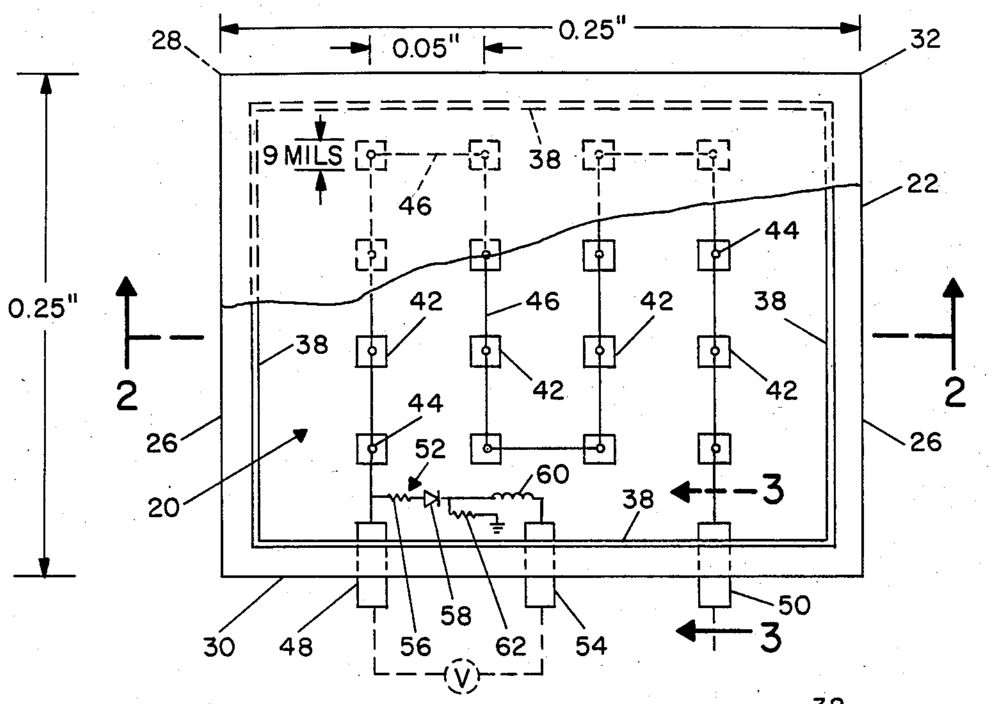
FIG. 1 is a stylized plan view of a box containing a microstrip circuit incorporating the invention, with a portion of the circuitry shown schematically.
Figure 2:
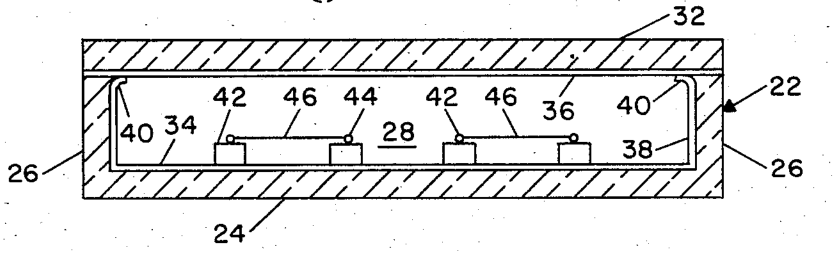
FIG. 2 is a sectional view of the box of FIG. 1 taken along the line 2—2.
Figure 3:
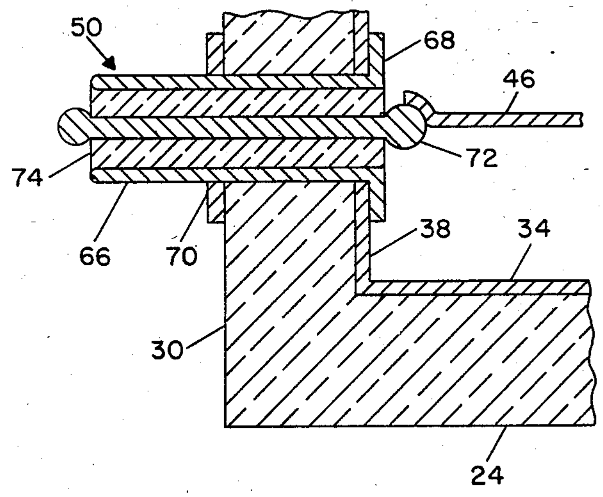
FIG. 3 is a sectional view taken along the line 3—3 of a connector in the box of FIG. 1.

In the embodiment of the invention disclosed in FIGS. 1 and 2, the delay line 20 is provided with variable capacitive elements in the form of varactor chips 42 which are disposed in a serial arrangement along the bottom 24, each of the varactor chips 42 having a lower terminal (not shown) in electrical contact with cladding 34 along bottom 24. Each varactor chip 42 is provided with a top terminal 44 which are connected together by microstrip conductor 46 having the form of a metallic ribbon, such as a gold ribbon. The microstrip conductor 46 traverses a path serially among the top terminals 44 of the respective varactor chips 42 so as to place each chip 42 in electrical connection between the microstrip conductor 46 and a ground plane provided by the bottom cladding 34. The resulting structure of the chips 42 placed between the conductor 46 and the ground plane has the desired configuration of a delay line.

The box 22 supports an input port 48 and an output port 50 in the front wall 30 of the box. One end of microstrip conductor 46 is connected to input port 48, and the other end of the microstrip conductor 46 is connected to output port 50. Thereby, ports 48 and 50 serve, respectively, as the input and output ports of the delay line 20.

A bias circuit 52 is connected to microstrip conductor 46 for impressing a voltage between conductor 46 and the ground plane provided by the cladding 34. As is well known, the capacitance of a varactor varies in accordance with the magnitude of a reverse-bias voltage applied across the terminals of the varactor. Thus, the bias circuit 52 provides the capability of impressing the requisite amount of bias voltage across each of the varactor chips 42 so as to impart the desired amount of capacitance to each of the chips 42. A port 54, supported within the front wall 30, is connected to bias circuit 52 so as to permit the connection of an external source (not shown) of voltage to the bias circuit 52.

Bias circuit 52 comprises a resistor 56, a diode 58, an inductor 60 in series. Inductor 60 is connected between diode 58 and bias port 54 with resistor 62 connecting the junction of diode 58 and inductor 60 to ground, the ground being provided by cladding 34. Resistor 56 connects conductor 46 with diode 58, the connection with conductor 46 being shown adjacent to input port 48. If desired, such connection may be made adjacent the output port 50, it being noted that the bias current is in the nature of a direct current (dc) which may be connected at any point of convenience to the delay line 20. The resistor 56 provides for a series voltage drop in the bias circuit 52 while the resistor 62 provides for a suitable load to the bias voltage source, and also serves to cooperate with the conductor 60 to attenuate any microwave energy which may tend to propagate along the bias circuit 52 and the port 54 to the bias voltage source. Diode 58 protects the delay line from an inadvertent reversal of the terminals of the bias voltage source.

The arrangement of the delay line 20 including its microstrip conductor 46 and its varactor chips 42 is best seen in FIG. 1 wherein the cover 32 of the box 22 has been partially cut away to disclose the configuration of the delay line 20. The remaining portion of the delay line 20 is shown in phantom. Each varactor chip 42 serves as a post or support for positioning conductor 46 at a predetermined spacing from the ground plane of the cladding 34. Thereby, a transverse electromagnetic wave can propagate along the conductor 46 with the electric field being directed between the conductor 46 and the ground plane. It is noted that the propagation of the electromagnetic wave is most readily observed at microwave frequencies, the connection of the chips 42 by the conductor 46 at substantially lower frequencies (below the megahertz frequency region) functioning more noticeably as a parallel connection of the varactor chips 42 to provide for phase shift at such lower frequencies.

The three ports 48, 50 and 54 may be of identical construction. By way of example, the output port 50 is disclosed in the enlarged sectional view of FIG. 3. The port 50 comprises a housing 64 which passes through the front wall 30. The housing includes a cylindrical case 66 terminating in a flange 68 on the interior side of the front wall 30, the cylindrical case 66 further including a flange 70 extending therefrom along the outer surface of the front wall 30. A rod 72 passes along the axis of the case 66 and is positioned therein and electrically insulated therefrom by a dielectric sleeve 74. Both the case 66 and the rod 72 are fabricated of an electrically conducting material such as cooper or aluminum. The port 50 has the configuration of a coaxial transmission line wherein the case 66 serves as the outer conductor and the rod 72 serves as the inner or central conductor of the coaxial transmission line. An end of the microstrip conductor 46 makes electrical contact with an end of the rod 72, the conductor 46 and the rod 72 being secured together as by soldering. With respect to the manner of the construction of the housing, the outer flange 70 may be secured to the case 66 in a well known manner, as by threading (not shown) whereby the flange 70 can be secured to the case 66 after the case 66 has been inserted into the front wall 30.

Figure 4:
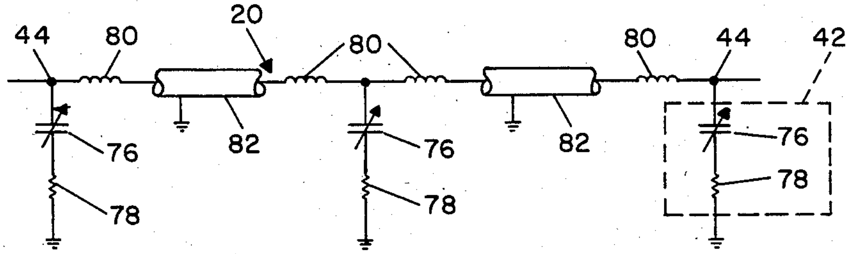
FIG. 4 is a schematic diagram of an equivalent circuit of the microstrip circuit of FIG. 1.

FIG. 4 shows, schematically, an electrical equivalent circuit for a portion of the delay line 20 of FIG. 1. Each varactor chip 42 is represented as a variable capacitor 76 in series with a resistor 78. The connection between the top terminal 44 of a varactor chip 42 and the microstrip conductor 46 is represented by an inductor 80, the inductance thereof representing the inductance of the elements of the connection, such elements being the length of wire in the terminal 44 and the length of wire employed in the connection of the conductor 46 to the terminal 44. As has been noted above with respect to the propagation of the electromagnetic wave along the microstrip conductor 46 between the varactor chips 42, each section of the conductor 46 in cooperation with the ground plane of the cladding 34 provides a transmission line, such transmission line 82 interconnecting the terminals 44 in series with the conductors 80 as depicted in FIG. 4. The capacitance of the capacitors 76 is understood to be variable in response to the application of a bias voltage between a terminal 44 and ground. Thereby, the electrical parameters of the delay line 20 can be varied by variation in the magnitude of the bias voltage with a resultant change in the propagation speed of the electromagnetic wave along the delay line 20. As is well known the propagation speed is dependent on the magnitude of the inductance and capacitance in the line and, accordingly, the foregoing change in capacitance results in the variation in the propagation speed.

By way of alternative embodiments, the set of varactor chips 42 of FIG. 1 may be replaced by a monolithic array of varactors each of which is formed as a mesa upstanding from a gallium arenside substrate. The elements of the interconnecting sections of transmission line 82 (FIG. 4) can then be formed by the selective deposition of metallic layers upon the substrate and upon supporting structures for spacing the microstrip conductor relative to the ground plane.

With reference to FIGS. 5–9, there is shown a procedure for the construction of the foregoing monolithic structure wherein the varactor chips are replaced by upstanding mesas. The FIGS. 5–9 relate to only a portion of the monolithic structure, the figures showing the construction of varactors and their interconnection with the transmission line, it being understood that the other varactors of the monolithic array are similarly formed.

Figures 5, 6, 7:
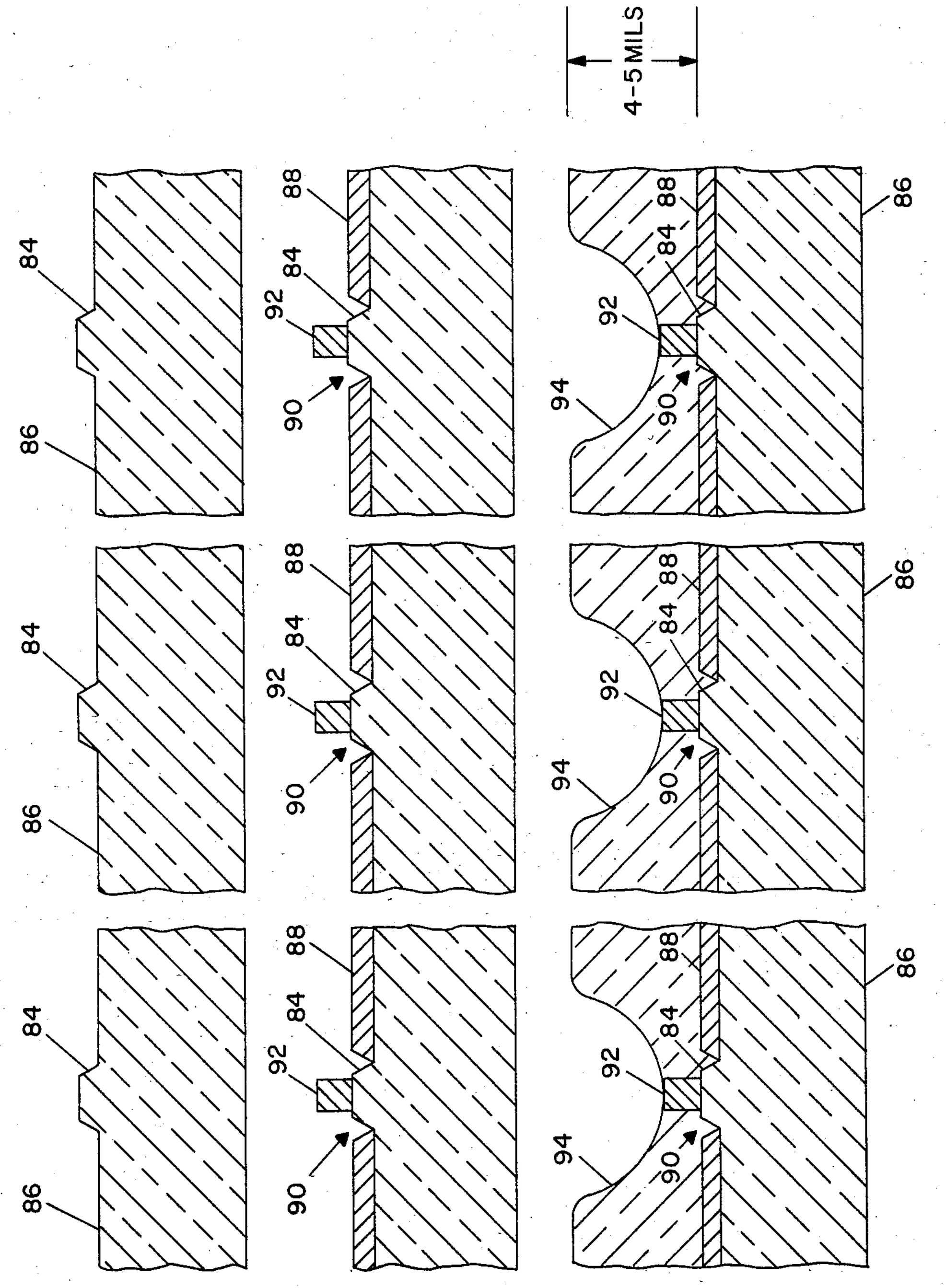
FIGS. 5–8 show a sequence of steps in the contruction of a monolithic embodiment of a varactor comprising mesas positioned between a ground plane and a microstrip conductor.
Figure 8:
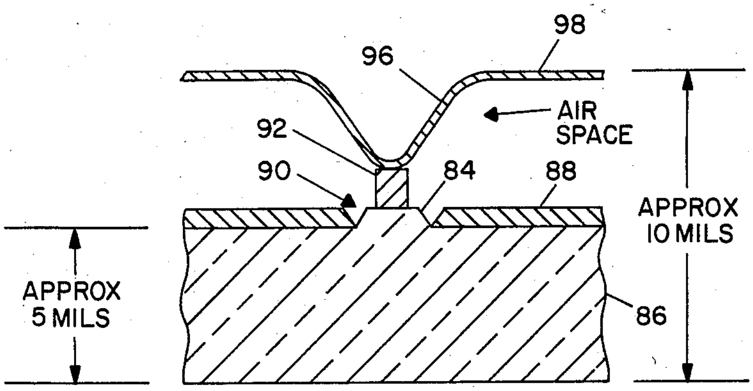
Figure 9:
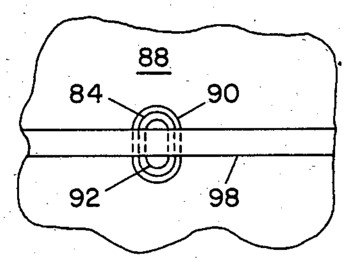
FIG. 9 is a plan view of the structure shown in FIG. 8.

The procedure begins with the development of an integral projection or mesa 84 formed from a substrate 86 such as n-doped galluim arsenide by conventional, well-known techniques. The thickness of the substrate 86 and the spacing between layer 88 and ribbon 98 which are the elements of the transmission line as shown directly on the figures are in mils (thousandths of an inch). A metallic layer of highly conductive metal, such as gold, is deposited on the substrate to form a layer 88 as depicted in FIG. 6. A circular aperture 90 is set within the layer 88 surrounding the base of mesa 84 so as to insulate the mesa 84 from the layer 88. A metal post 92, preferably of gold, is built upon mesa 84 and the surrounding region is covered with a coating 94 of photoresist as shown in FIG. 7. Thereupon, a portion of the coating 94, directly above the post 92, is etched away and a metallic layer 96 is deposited on top of the coating 94 as shown in FIG. 8. The layer 96 dips down to contact the post 92 in the region wherein the coating 94 has been etched away. Thereupon, portions of the layer 96 are etched away to leave a gold ribbon 98 (plan view of FIG. 9) which serves as the microstrip conductor 46 of FIG. 1.

In the construction of the ribbon 98, the coating 94 of photoresist may be completely etched away to provide an empty air space which serves as an insulator between the ribbon 98 and the layer 88. Alternatively, the foregoing construction may utilize some other form of electrical insulator such as silicon dioxide, which would be deposited in lieu of the photoresist and which, after formation of the ribbon 98, would remain as the insulating member between the ribbon 98 and the layer 88.

The monolithic embodiment is advantageous in that the internal resistance of the varactor is minimized to reduce any insertion losses associated with use of the delay line 20 of FIG. 1. In FIG. 2, the chips 42 are approximately 4.5 mils high, this height being sufficient to provide the desired spacing between the conductor 46 and the ground plane. In FIG. 8, the post 92 is substantially shorter and, accordingly, layer 96 and ribbon 98 formed therefrom dip down from the 4.5 mil spacing at the site of mesa 84 to contact post 92. Suitable spacing between ribbon 98 and the ground plane provided by layer 88 for an impedance of 50 ohms is in the range of 4–5 mils. The impedance of the input port 48, the output port 50, and of the transmission line 82 is conveniently set at 50 ohms, though other values of impedance can be utilized if desired. By use of the 16 varactors, as depicted in FIG. 1, or by use of the monolithic structure of FIG. 8, a delay variation in excess of 83 picoseconds has been obtained for a corresponding change in magnitude of back bias voltage from 45 volts to 8 volts. Such change in delay has been obtained with less than one decibel loss at a frequency of 6 gigahertz. Thus, the delay line provides characteristics useful for a number of situations in signal processing, including RF (radio frequency) weighting, group delay compensation, and phase shifting over a frequency band ranging from DC (direct current) through K band.

FIG. 10 provides an example in the use of the delay line of the invention in an amplifier circuit 100 to compensate for variations in signal transit time through an amplifier 102, which variations occur as a function of changing gain of the amplifier 102. The circuit 100 comprises an input terminal 104, an output terminal 106, delay line 20 according to the invention, an amplifier 108 which provides a control voltage to the bias port 54 of the delay line 20, an analog multiplier 110, a 90° phase shifter 112, and a coupler 114 for extracting a sample of the signal at output terminal 106 for application via phase shifter 112 to multiplier 110. In operation, the output sample provided by coupler 114 is applied via phase shifter 112 to an input terminal of multiplier 110. Shifter 112 imparts a phase shift of 90° to the output signal sample. Input terminal 104 connects with both delay line 20 and the second input terminal of the multiplier 110, the connection to the multiplier 110 being provided via a fixed delay unit 116. The magnitude of the delay provided by fixed delay unit 116 is equal to a nominal value of delay provided by delay line 20 resulting from a reference voltage 118 applied to amplifier 108 to control delay line 20 via bias port 54 and a nominal value of delay due to transit time through amplifier 102.

Assuming that the propagation time for signals passing through delay line 20 and amplifier 102 is equal to that of the delay of unit 116, then the two signals at the input terminals of multiplier 110 are 90° out of phase. Amplifier 108 is an operational amplifier of which one input terminal is connected to a fixed voltage reference source 118 while the other input terminal of amplifier 108 connects with the output terminal of the multiplier 110. In the case where the two input signals to multiplier 110 are 90° out of phase, the output product of the multiplier 110 is equal to zero in which case the output voltage of the amplifier 108, applied to bias port 54 of delay line 20, has a magnitude based on that of source 118. In the event that the propagation time between the input and output terminals 104 and 106 differs from the delay of the units 116, then the foregoing 90° phase relationship between the input signals of the multiplier 110 is altered with the result that the amplifier 107 provides an altered magnitude of bias voltage to delay line 20. Changes in delay resulting from changes in transit time through amplifier 102 are inversely matched to the delay caused by delay line 20. This matching is accomplished by the varying gain of amplifier 108, the output of which is applied to bias port 54 of delay line 20. Thereby, delay line 20 functions to increase or decrease delay to compensate for decreases or increases in transit time through amplifier 102 so as to maintain a constant delay between the input terminal 104 and the output terminal 106 of the circuit 100. In the case wherein amplifier 102 is a limiting amplifier, such changes in transit may occur with variations in the amplifier gain. Since such an amplifier may well be utilized as part of a signal processing system, it is important that such signal transit-time variations be compensated. The circuit 100 provides this compensation. The circuit of the amplifier 108 is understood to include a low pass filter and similar well-known circuitry as is utilized in the control of feedback system.

The box of FIG. 1 can be made in a relatively small size, 0.25 inch by 0.25 inch. The spacing between the varactor chips 42 is 0.05 inch. The varactor chips 42 measure 9 mils on a side. The ribbon 98 may be fabricated as 1-mil gold wire or $\frac{1}{4}\times 2$ mil gold ribbon. The ground plane provided by the cladding 34 may be fabricated as a Kovar plate. While the array of FIG. 1 shows 16 chips, it is to be understood that a longer or shorter series array of varactor chips may be utilized. If desired, the width of the microstrip conductor 46 may be increased to 5 mils in which case the bonding of the end of the microstrip conductor to the terminal 44 of a varactor chip 42 is accomplished by a bond wire of 1 mil, which interconnection produces the inductance represented by the inductor 80 (FIG. 4). The nominal capacitance of the varactor is 1 picofarad.

Experimental models of the invention have shown that, in the case of a 50 ohm delay line, the VSWR (voltage standing wave ratio) has a maximum value of 1.18. The electric length at 6 gigahertz is in the range of 1.22 to 1.72 wave lengths, this being greater than a 180° phase shift. The theoretical loss is 0.56 to 1 dB (decibel) with a 0.44 dB variation. The group delay is in the range of 0.2032 to 0.2864 nanoseconds with a variation of at least 83.2 picoseconds. The total capacitance at base band is in the range of 3.4 to 6.8 picofarads.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A microwave circuit including a microwave circuit input port and a microwave circuit output port and having a fixed delay, said microwave circuit comprising:

(a) a first amplifier having an input port and an output port, said output port of the first amplifier being the microwave circuit output port;

(b) a variable microwave delay circuit having an input port, a control port and an output port connected to the first amplifier input port, said variable delay circuit including a plurality of varactor diodes and means for applying a bias voltage to individual ones of said diodes, said input port of the delay circuit being the microwave circuit input port;

(c) a fixed delay circuit having an input port connected to the variable microwave delay input and an output port;

(d) a phase shifter having an input port connected via a coupler to the first amplifier output port and an output port;

(e) a mixer having a first input port connected to the fixed delay output port, a second input port connected to the phase shifter output port and an output port;

(f) a reference voltage source; and (g) a second amplifier having a first input port connected to said reference voltage source, second input port connected to the mixer output port and an output port connected to the variable delay control port whereby varying the reference voltage the variable microwave delay circuit functions to increase or decrease delay to compensate for decreases or increases in transit time through the first amplifier thereby maintaining a constant delay between the variable delay input port and the first amplifier output port; said variable delay circuit comprising:

(1) a substrate;

(2) a plurality of gallium arsenide mesas developed upon said substrate;

(3) a metallized layer disposed on and supported by said substrate as to encircle each of said mesas, said layer including a set of apertures disposed about corresponding ones of said mesas for electrically insulating individual ones of said mesas from said layer;

(4) each of said mesas having an electrically conducting post extending therefrom to provide capacitance through the mesa between the conducting post and said metallized layer;

(5) a stripline conductor serially interconnecting the posts of respective ones of said mesas and being insulated from said metallized layer, the inductance of said conductor coacting with the capacitance of each of said measa to provide a delay to signals propagating along said conductor;

(6) the variable delay circuit input port being one end of the stripline conductor;

(7) the variable delay circuit output port being the other end of the stripline conductor; and (8) means for applying a bias voltage via said stripline conductor to each of the individual ones of mesas to adjust capacitance provided to said stripline circuit, the variable delay circuit control port being the means for applying.

2. A variable microwave delay line comprising:

(a) a substrate having a set of at least two varactor diodes having first and second terminals, each of said diodes formed as a monolithic structure comprising a mesa integral with and upstanding from said substrate;

(b) an electrically conductive layer disposed on said substrate and connected to said first terminals, said layer having insulating apertures within which said mesa are positioned for insulating said electrically conductive layer from said mesa;

(c) a microstrip transmission line joining individual ones of said second terminals of said diodes, said diodes shunted between the transmission line and a point of ground potential for providing capacitance therebetween and being arranged serially along said transmission line between an input port thereof and an output port thereof, said transmission line for transmitting microwave signals, said electrically conductive layer forming a part of said microstrip transmission line; and (d) first means for applying a bias voltage via said transmission line to each of the individual ones of said diodes to adjust the capacitance provided by said diodes to said transmission line, said first means attenuating any microwave energy propagating from said transmission line to said first means.

3. A delay line according to claim 1 wherein said layer is a metallic layer, said layer serving as a ground plane, said transmission line further comprising an electrically conducting wire interconnecting the second terminals of said varactor diodes, said wire being uniformly spaced above said ground plane to provide a predetermined impedance to said transmission line, said substrate and integral mesas comprising n+ GaAs.

4. A delay line according to claim 3 wherein each of said second terminals of said varactor diodes comprises a metallic post upstanding from said mesa to contact said wire, and wherein an insulating medium is located between said wire and said metallic layer.

5. A delay circuit comprising:

(a) a substrate;

(b) a plurality of gallium arsenide mesas developed upon said substrate;

(c) a metallized layer disposed on and supported by said substrate as to encircle each of said mesas, said layer including a set of apertures disposed about corresponding ones of said mesas for electrically insulating individual ones of said mesas from said layer;

(d) each of said mesas having an electrically conducting post projecting from said mesa to provide capacitance through the mesa between the conducting post and said metallized layer; and (e) a stripline conductor serially interconnecting the posts of respective ones of said mesas and being insulated from said metallized layer, the inductance of said conductor coacting with said capacitance to provide a delay to microwave signals propagating along said conductor.

6. A delay circuit according to claim 7 wherein said stripline conductor is formed of gold ribbon and wherein said metallized layer is a deposition of gold upon said substrate.

7. A delay circuit according to claim 8 further comprising low-loss dielectric material disposed between said ribbon and said layer for positioning said ribbon relative to said layer while minimizing attenuation to signals propagating along said stripline conductor.

8. A delay circuit according to claim 7 further comprising means coupled between said stripline conductor and said metallized layer for connecting a bias voltage from a source of such voltage to said conductive posts, said capacitance varying in response to variations in the magnitude of the bias voltage, whereby the amount of delay imparted by said delay circuit to signals propagating along said stripline conductor depends on the magnitude of said capacitance.

* * * * *